(12) United States Patent
Youn et al.

(10) Patent No.: US 11,016,384 B2
(45) Date of Patent: May 25, 2021

(54) PHOTOSENSITIVE RESIN COMPOSITION, PHOTOSENSITIVE RESIN LAYER AND COLOR FILTER USING SAME

(71) Applicant: SAMSUNG SDI CO., LTD., Yongin-si (KR)

(72) Inventors: Jinsuop Youn, Suwon-si (KR); Misun Kim, Suwon-si (KR); Jiyoung Jeong, Suwon-si (KR); Obum Kwon, Suwon-si (KR); Jonggi Kim, Suwon-si (KR); Hojeong Paek, Suwon-si (KR); Bumjin Lee, Suwon-si (KR); Jihyeon Yim, Suwon-si (KR); Hyunjoo Han, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 314 days.

(21) Appl. No.: 16/074,058

(22) PCT Filed: Jan. 24, 2017

(86) PCT No.: PCT/KR2017/000830
§ 371 (c)(1),
(2) Date: Jul. 30, 2018

(87) PCT Pub. No.: WO2017/217631
PCT Pub. Date: Dec. 21, 2017

(65) Prior Publication Data
US 2019/0041747 A1    Feb. 7, 2019

(30) Foreign Application Priority Data

Jun. 14, 2016 (KR) .................. 10-2016-0073886

(51) Int. Cl.
| | | |
|---|---|---|
| G03F 7/028 | (2006.01) | |
| G02B 5/20 | (2006.01) | |
| G03F 7/00 | (2006.01) | |
| C08F 20/38 | (2006.01) | |
| C08K 3/22 | (2006.01) | |
| C08K 3/30 | (2006.01) | |
| G03F 7/004 | (2006.01) | |
| G03F 7/027 | (2006.01) | |
| G03F 7/033 | (2006.01) | |
| C08K 3/28 | (2006.01) | |
| C08F 2/50 | (2006.01) | |
| C08K 3/26 | (2006.01) | |
| C08K 5/3492 | (2006.01) | |
| G02B 5/22 | (2006.01) | |

(52) U.S. Cl.
CPC ............. *G03F 7/0007* (2013.01); *C08F 2/50* (2013.01); *C08F 20/38* (2013.01); *C08K 3/22* (2013.01); *C08K 3/26* (2013.01); *C08K 3/28* (2013.01); *C08K 3/30* (2013.01); *C08K 5/3492* (2013.01); *G02B 5/20* (2013.01); *G03F 7/0047* (2013.01); *G03F 7/027* (2013.01); *G03F 7/0275* (2013.01); *G03F 7/033* (2013.01); *C08K 2003/265* (2013.01); *C08K 2003/3045* (2013.01); *G02B 5/223* (2013.01)

(58) Field of Classification Search
CPC ........ G03F 7/0007; G03F 7/004; G03F 7/027; G03F 7/0275; G03F 7/028; G03F 7/033; C08F 20/38; G02B 5/201; G02B 5/20; G02B 5/206; G02B 5/223; G02F 1/133514; G02F 1/133516
USPC ....................................... 430/7, 270.1, 281.1
See application file for complete search history.

(56) References Cited

U.S. PATENT DOCUMENTS

| | | | |
|---|---|---|---|
| 2012/0071579 A1 | 3/2012 | Kitano et al. | |
| 2013/0130176 A1 | 5/2013 | Kim et al. | |
| 2015/0083970 A1 | 3/2015 | Koh et al. | |
| 2015/0368553 A1 | 12/2015 | Nelson et al. | |
| 2017/0183567 A1* | 6/2017 | Zhou ...................... G03F 7/027 |

FOREIGN PATENT DOCUMENTS

| | | |
|---|---|---|
| CN | 1655057 A | 8/2005 |
| CN | 101652713 A | 2/2010 |
| JP | 7-37503 B2 | 4/1995 |
| JP | 4776616 82 | 9/2011 |
| JP | 2016-40365 A | 3/2016 |
| KR | 1994-0002548 B1 | 3/1994 |
| KR | 10-2009-0042341 A | 4/2009 |
| KR | 10-1403791 B1 | 6/2014 |
| KR | 10-1415498 B1 | 7/2014 |
| KR | 10-1583538 81 | 1/2016 |
| KR | 10-1588317 B1 | 1/2016 |
| KR | 10-2016-0028276 A | 3/2016 |
| KR | 10-2016-0035515 A | 3/2016 |
| TW | 201616223 A | 5/2016 |
| WO | WO 2016/035602 A1 | 3/2016 |
| WO | WO 2016/081219 A1 | 5/2016 |

OTHER PUBLICATIONS

Chinese Office Action and search report dated Feb. 10, 2021 for corresponding Chinese Patent Application No. 201780024371.5, 7 pages.

* cited by examiner

*Primary Examiner* — John A McPherson
(74) *Attorney, Agent, or Firm* — Lewis Roca Rothgerber Christie LLP

(57) ABSTRACT

Provided are a photosensitive resin composition including (A) a photo-conversion material; (B) a binder resin including an acryl-based repeating unit including one or more thiol groups at the terminal end; (C) a photopolymerization initiator; and (D) a solvent, a photosensitive resin layer manufactured using the same, and a color filter including the photosensitive resin layer.

20 Claims, 1 Drawing Sheet

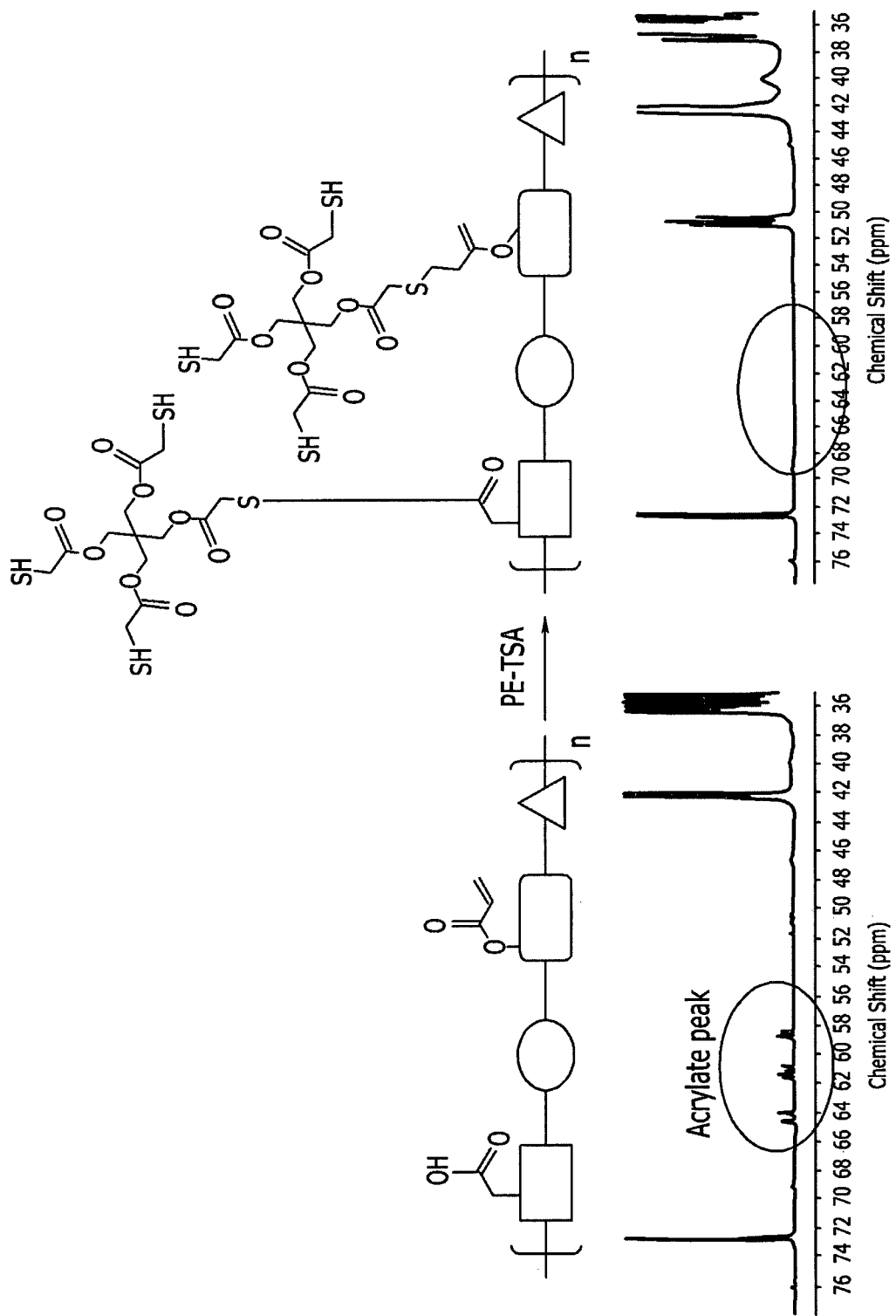

PHOTOSENSITIVE RESIN COMPOSITION, PHOTOSENSITIVE RESIN LAYER AND COLOR FILTER USING SAME

CROSS-REFERENCE TO RELATED APPLICATIONS

This application is a National Phase Patent Application and claims priority of International Application Number PCT/KR2017/000830, filed Jan. 24, 2017 which claims priority to and the benefit of Korean Patent Application No. 10-2016-0073886 filed in the Korean Intellectual Property Office on Jun. 14, 2016, the entire contents of each is incorporated herein by reference.

TECHNICAL FIELD

This disclosure relates to a photosensitive resin composition, a photosensitive resin layer manufactured using the same, and a color filter including the photosensitive resin layer.

BACKGROUND ART

In general, a color filter applied to a display is formed by using a photosensitive resist composition, forming a desired pattern through an exposure process by using a photomask, and then, dissolving and removing a non-exposed region through a development process. A material for the color filter may be required of alkali-solubility, high sensitivity, adherence to a substrate, chemical resistance, heat resistance, and the like. As for a color material, a pigment or a dye is generally used. However, the pigment has excellent thermal or chemical resistance but is not well dispersed in a solvent and thus has no excellent color characteristics such as luminance, and the dye has excellent color characteristics but deteriorated durability, and thus no excellent thermal or chemical resistance. Accordingly, a novel photoluminescent-type photosensitive resin composition capable of overcoming a technological limit of a currently-used photosensitive resin composition using the pigment or the dye as a color material and a color filter material applying this novel photoluminescent-type photosensitive resin composition are being continuously developed.

DISCLOSURE

Technical Problem

A material for the color filter may be required of alkali-solubility, high sensitivity, adherence to a substrate, chemical resistance, heat resistance, and the like. As for a color material, a pigment or a dye is generally used. However, the pigment has excellent thermal or chemical resistance but is not well dispersed in a solvent and thus has no excellent color characteristics such as luminance, and the dye has excellent color characteristics but deteriorated durability, and thus no excellent thermal or chemical resistance.

Technical Solution

An embodiment provides a photosensitive resin composition having improved color reproducibility, color purity, viewing angles, and the like without using a pigment and a dye.

Another embodiment provides a photosensitive resin layer having an improved photo-conversion rate manufactured using the photosensitive resin composition.

Yet another embodiment provides a color filter including the photosensitive resin layer.

An embodiment provides a photosensitive resin composition including (A) a photo-conversion material; (B) a binder resin including an acryl-based repeating unit including one or more thiol groups at the terminal end; (C) a photopolymerization initiator; and (D) a solvent.

The acryl-based repeating unit including one or more thiol groups at the terminal end may be represented by Chemical Formula 1.

Chemical Formula 1

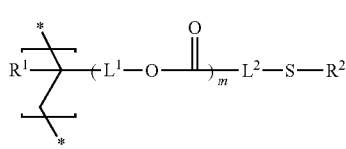

In Chemical Formula 1, $R^1$ is a hydrogen atom or a substituted or unsubstituted C1 to C6 alkyl group, $R^2$ is a substituted or unsubstituted C1 to C10 alkyl group including one or more terminal ends at the terminal end, a substituted or unsubstituted C6 to C20 aryl group including one or more terminal ends at the terminal end, or a substituted or unsubstituted C2 to C10 heteroaryl group including one or more terminal ends at the terminal end, $L^1$ is a single bond or a substituted or unsubstituted C1 to C10 alkylene group, $L^2$ is *-$L^a$-C(=O)—*, *—C(=O)O-$L^b$-O(C=O)NH-$L^c$-O(C=O)-$L^d$-*, *—C(=O)O-$L^e$-O-$L^f$-O(C=O)-$L^g$-*, a substituted or unsubstituted C1 to C10 alkylene group, or a substituted or unsubstituted C6 to C20 arylene group, $L^a$ to $L^g$ are independently a single bond or a substituted or unsubstituted C1 to C5 alkylene group, and m is an integer of 0 or 1.

The $L^f$ may be a hydroxy group-substituted C1 to C5 alkylene group.

The $R^2$ may be a substituent selected from Chemical Formula 2-1 to Chemical Formula 2-3.

Chemical Formula 2-1

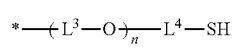

Chemical Formula 2-2

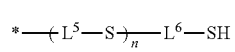

Chemical Formula 2-3

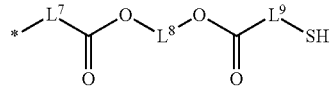

In Chemical Formula 2-1 to Chemical Formula 2-3, $L^3$ to $L^9$ are independently a substituted or unsubstituted C1 to C10 alkylene group, and n is an integer of 1 to 5.

The $R^2$ may be a substituent selected from Chemical Formula A-1 to Chemical Formula A-6.

Chemical Formula A-1

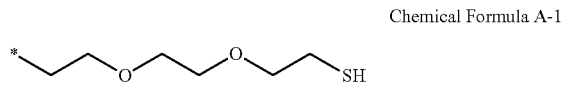

-continued

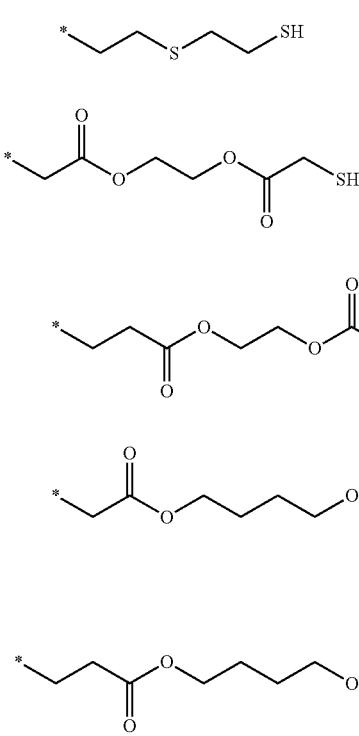

Chemical Formula A-2

Chemical Formula A-3

Chemical Formula A-4

Chemical Formula A-5

Chemical Formula A-6

The $R^2$ may be a substituent selected from Chemical Formula 3-1 to Chemical Formula 3-3.

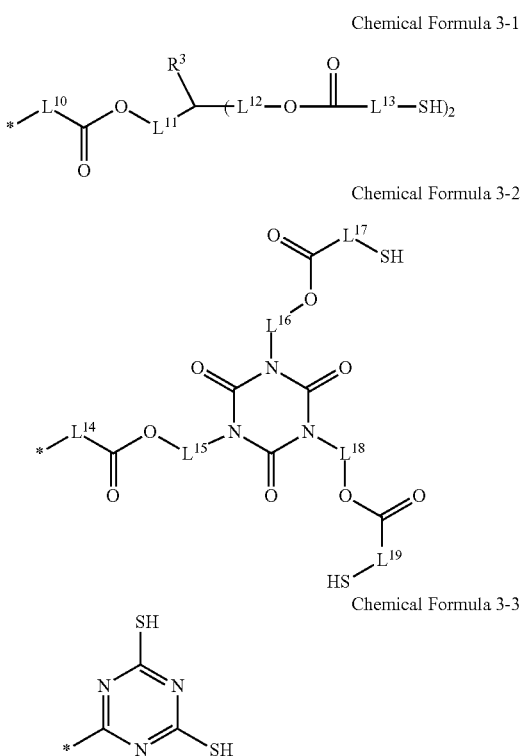

Chemical Formula 3-1

Chemical Formula 3-2

Chemical Formula 3-3

In Chemical Formula 3-1 and Chemical Formula 3-2, $R^3$ is a substituted or unsubstituted C1 to C10 alkyl group, and $L^{10}$ to $L^{19}$ are independently a substituted or unsubstituted C1 to C10 alkylene group.

The $R^2$ may be a substituent selected from Chemical Formula B-1 to Chemical Formula B-4.

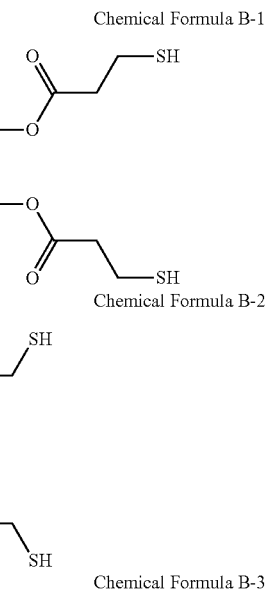

Chemical Formula B-1

Chemical Formula B-2

Chemical Formula B-3

Chemical Formula B-4

The $R^2$ may be a substituent represented by Chemical Formula 4-1.

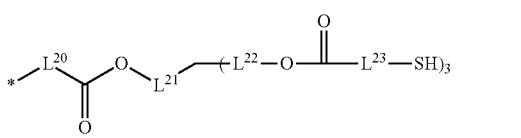

Chemical Formula 4-1

In Chemical Formula 4-1, $L^{20}$ to $L^{23}$ are independently a substituted or unsubstituted C1 to C10 alkylene group.

The $R^2$ may be a substituent represented by Chemical Formula C-1 or Chemical Formula C-2.

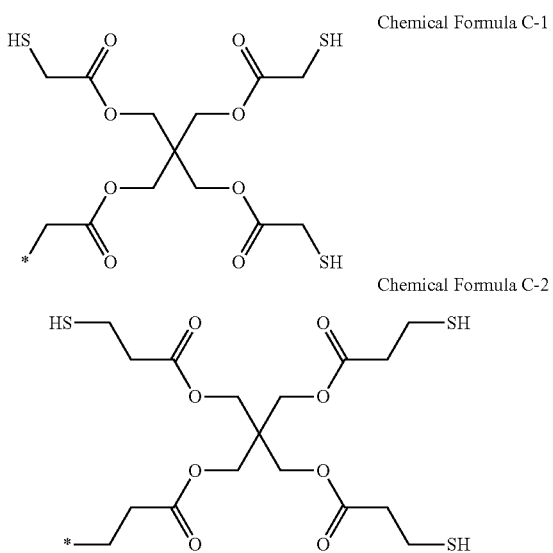

The $R^2$ may be a substituent represented by Chemical Formula 5-1.

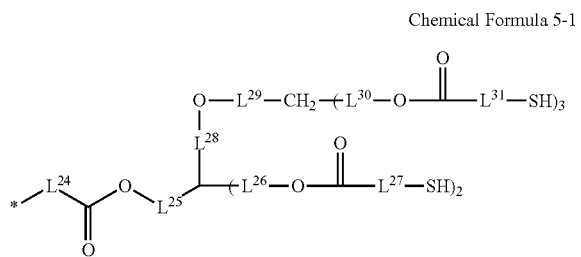

In Chemical Formula 5-1, $L^{24}$ to $L^{31}$ are independently a substituted or unsubstituted C1 to C10 alkylene group.

The $R^2$ may be a substituent represented by Chemical Formula D-1.

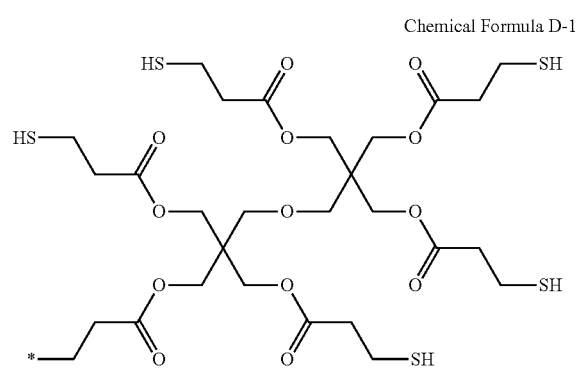 [SMILES: *CCC(=O)OCC(COCC(COC(=O)CCS)(COC(=O)CCS)COC(=O)CCS)(COC(=O)CCS)COC(=O)CCS]

The photosensitive resin composition may further include (E) a scatterer.

The scatterer may include barium sulfate, calcium carbonate, titanium dioxide, zirconia, or a combination thereof.

The scatterer may be included in an amount of 0.1 wt % to 5 wt % based on the total weight of the photosensitive resin composition.

The photosensitive resin composition may further include (F) a photopolymerizable monomer.

The photo-conversion material may be a quantum dot that absorbs light in a wavelength region of 360 nm to 780 nm and emits fluorescence in a wavelength region of 500 nm to 700 nm.

The photosensitive resin composition may include 1 wt % to 50 wt % of the (A) photo-conversion material; 10 wt % to 20 wt % of (B) the binder resin; 0.1 wt % to 5 wt % of (C) the photopolymerization initiator; and a balance amount of (D) the solvent based on the total amount of the photosensitive resin composition.

The photosensitive resin composition may further include malonic acid; 3-amino-1,2-propanediol; a silane-based coupling agent; a leveling agent; fluorine-based surfactant; or a combination thereof.

Another embodiment provides a photosensitive resin layer manufactured using the photosensitive resin composition.

Yet another embodiment provides a color filter including the photosensitive resin layer.

Other embodiments of the present invention are included in the following detailed description.

Advantageous Effects

A photosensitive resin composition having excellent color reproducibility, color purity, viewing angle, and the like may be provided by using a photoconversion material instead of a pigment or a dye conventionally used as a color material and luminous efficiency deterioration is minimized and a color filter having an excellent photo-conversion rate may be provided by using this photosensitive resin composition.

DESCRIPTION OF DRAWINGS

FIG. 1 is a schematic view of a conventional binder resin and the binder resin that is obtained by modifying the same according to Synthesis Example 1 and their nuclear magnetic resonance (NMR) data.

BEST MODE

Hereinafter, embodiments of the present invention are described in detail. However, these embodiments are exemplary, the present invention is not limited thereto and the present invention is defined by the scope of claims.

In the present specification, when specific definition is not otherwise provided, "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C6 to C20 arylalkyl group, the term "alkylene group" refers to a C1 to C20 alkylene group, the term "arylene group" refers to a C6 to C20 arylene group, the term "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

In the present specification, when specific definition is not otherwise provided, the term "substituted" may refer to substitution with a halogen atom (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof, instead of at least one hydrogen.

In the present specification, when specific definition is not otherwise provided, the term "hetero" may refer to one substituted with at least one hetero atom of N, O, S and P, in a chemical formula.

In the present specification, when specific definition is not otherwise provided, "(meth)acrylate" refers to both "acrylate" and "methacrylate", and "(meth)acrylic acid" refers to "acrylic acid" and "methacrylic acid".

In the present specification, when specific definition is not otherwise provided, the term "combination" refers to mixing or copolymerization.

In the present specification, unless a specific definition is otherwise provided, a hydrogen atom is boned at the position when a chemical bond is not drawn where supposed to be given.

In the present specification, when specific definition is not otherwise provided, "*" indicates a point where the same or different atom or chemical formula is linked.

A photosensitive resin composition according to an embodiment includes (A) a photo-conversion material; (B) a binder resin including an acryl-based repeating unit including one or more thiol groups at the terminal end; (C) a photopolymerization initiator; and (D) a solvent, wherein the binder resin includes a repeating unit including one or more thiol groups at the terminal end, and thereby luminous efficiency deterioration is minimized through passivation of the photo-conversion material, and a photosensitive resin layer having excellent luminous efficiency and a color filter including the same are provided.

A quantum dot being established as a new technology trend in a display field may be applied to various displays, electronic devices, and the like besides TV and light emitting diode (LED). The quantum dot represented by CdSe, InP, and the like is rapidly developed in terms of luminous efficiency (quantum efficiency, a quantum yield), and recently, a method of synthesizing the quantum dot to have luminous efficiency near to 100% has been suggested. Now, quantum dot super ultra high definition television (QD SUHD TV) manufactured by applying a quantum dot sheet (a QD sheet) is commercially available. However, TV using not a filtering type but self light-emitting type color resist layer by including a photo-conversion material such as the quantum dot and the like (but excluding a pigment and a dye) in a conventional color resist layer in LED TV has not been developed yet. The development of this type TV essentially depends on patterning a photosensitive resin composition including the quantum dot and also, maintaining photo-efficiency of the photo-conversion material such as the quantum dot and the like and embodying a pattern formation during a prebaking process, an exposure process, a development process, a washing process, a post baking process, and the like.

Hereinafter, each component is described in detail.
(A) Photo-Conversion Material The photo-conversion material may absorb light in a wavelength region of 360 nm to 780 nm, for example 400 nm to 780 nm and emit fluorescence in a wavelength region of 500 nm to 700 nm, for example, 500 nm to 580 nm, or 600 nm to 680 nm. That is, the photo-conversion material may have a maximum fluorescence wavelength (fluorescence $\lambda_{em}$) in a wavelength of 500 nm to 680 nm.

For example, the photo-conversion material may be a quantum dot.

The quantum dot may have a full width at half maximum (FWHM) in a range of 20 nm to 100 nm, for example, 20 nm to 50 nm. When the quantum dot has a full width at half maximum (FWHM) within the range, the quantum dot has high color purity and thus an effect on increasing color reproducibility when used as a color material in a color filter.

The quantum dot may be an organic material, an inorganic material, or a hybrid (mixture) of the organic material and the inorganic material.

The quantum dot may comprise a core and a shell surrounding the core, and herein, the core and the shell may have a structure such as a core independently comprising II-IV groups, III-V groups, and the like, a core/a shell, a core/a first shell/a second shell, an alloy, an alloy/a shell, and the like but are not limited thereto.

For example, the core may include at least one material selected from CdS, CdSe, CdTe, ZnS, ZnSe, ZnTe, HgS, HgSe, HgTe, GaN, GaP, GaAs, InP, InAs, and an alloy thereof but is not necessarily limited thereto. The shell surrounding the core may include at least one material selected from CdSe, ZnSe, ZnS, ZnTe, CdTe, PbS, TiO, SrSe, HgSe, and an alloy thereof but is not necessarily limited thereto.

In an embodiment, since an interest in an environment has been recently much increased over the whole world, and a regulation about a toxic material also has been fortified, a non-cadmium-based light emitting material (InP/ZnS) having little low quantum efficiency (quantum yield) but being environmentally-friendly instead of a light emitting material having a cadmium-based core is used but not necessarily limited thereto.

The quantum dot having a core/shell structure may have an entire size including the shell (an average particle diameter) of 1 nm to 15 nm, for example, 5 nm to 15 nm but its structure is not particularly limited.

For example, the quantum dot may be a red quantum dot, a green quantum dot, or a combination thereof. The red quantum dot may have an average particle diameter of 10 nm to 15 nm. The green quantum dot may have an average particle diameter of 5 nm to 8 nm.

On the other hand, the photosensitive resin composition according to an embodiment may further include a dispersing agent for dispersion stability of the quantum dot. The dispersing agent may help a photo-conversion material such as the quantum dot uniformly dispersed in the photosensitive resin composition and include a non-ionic, anionic, or cationic dispersing agent. Specifically, the dispersing agent may include polyalkylene glycol or esters thereof, polyoxy alkylene, polyhydric alcohol ester alkylene oxide addition products, alcohol alkylene oxide addition products, sulfonate esters, sulfonate salts, carboxylate esters, carboxylate salts, alkyl amide alkylene oxide addition products, alkyl amines. They may be used alone or as a mixture of two or more. The dispersing agent may be used in an amount of 0.1 wt % to 100 wt %, for example, 10 wt % to 20 wt % based on the solid of the photo-conversion material.

The photo-conversion material may be included in an amount of 1 wt % to 50 wt %, for example, 10 wt % to 30 wt % based on the total amount of the photosensitive resin composition according to an embodiment. When the photo-conversion material is included within the range, an excellent photoconversion rate may be obtained, and in addition, excellent processability may be obtained, since pattern characteristics and development characteristics are not deteriorated.

(B) Binder Resin

The binder resin includes an acryl-based repeating unit including one or more thiol groups at the terminal end. For example, the binder resin may be an acryl-based copolymer including an acryl-based repeating unit including one or more thiol groups at the terminal end.

In general, a binder resin used in a photosensitive resin composition for a color filter is polymerized by using a monomer including a carboxyl group and a hydroxy group. Resultantly, this polymerized binder resin cannot but include a plenty of carboxyl group and hydroxy group. The hydroxy group forms a hydrogen bond with a substrate (a glass or a film) and thus increases adherence of the binder resin to the substrate and also, applies hydrophilicity to the binder resin and thus improves its wettability about a developing solution (e.g., an alkali aqueous solution) during the development process. In addition, the carboxyl group has a hydrogen bond with the substrate like the hydroxy group and thus increases adherence of the binder resin to the substrate and also, has an acid-base reaction with the developing solution (e.g., the alkali aqueous solution) and generates salt, and since this salt is dissolved in water, the carboxyl group is a key functional group ultimately applying developability.

However, when this conventional binder resin for a photosensitive resin composition for a color filter is used with the photo-conversion material such as a quantum dot and the like, dispersibility or luminous efficiency (quantum efficiency; quantum yield) of the quantum dot may be deteriorated due to compatibility between the two functional groups (hydroxy group and carboxyl group) of the binder resin and the photo-conversion material. In particular, since the functional groups (hydroxy group and carboxyl group) quench the QD in a color filter process performed by applying heat (e.g., a prebaking process, a postbaking process, or the like), it is difficult to select a binder resin usable with the photo-conversion material such as the quantum dot instead of a conventional pigment or dye as a colorant for a photosensitive resin composition.

However, according to an embodiment, a vinyl group or an acrylate group is made to remain in the general binder resin, for example, an acryl-based binder resin and then, reacted with a thiol-based monomer to form a site workable as a multidentate ligand in the photo-conversion material such as the quantum dot and the like. The reaction between the thiol group and the vinyl group or between the thiol group and the acrylate group is known as a thiol-ene click reaction, which is well performed under a mild condition and known to have a high yield. Furthermore, since protons of the thiol group appear more acidic than protons of the hydroxy group (e.g., a thiol group in pentaerythritol tetrakis (2-mercaptoacetate) (PE-TSA) has pKa of 12.9 (in dimethyl sulfoxide (DMSO)) and thus no much difference from carboxylic acid having pKa of 12.6 (in DMSO)), the thiol group in the binder resin has an acid-base reaction with an alkali developing solution and generates salt, and the salt is dissolved in water, and thus the binder resin including a repeating unit including one or more thiol groups at the terminal end may realize a pattern by itself (i.e., without the carboxylic acid).

The thiol group in the binder resin has strong affinity on the surface of the quantum dot and thus plays a role of stabilizing the quantum dot as a ligand and resultantly, prevent deterioration of luminous efficiency (quantum efficiency, a quantum yield) of the quantum dot and stabilize the quantum dot. In other words, the thiol ligand having strong affinity on the surface of the quantum dot passivates a defect on the surface of the quantum dot or a dangling bond and thus stabilizes the quantum dot.

In other words, according to an embodiment, a pattern may be simultaneously realized without deteriorating luminous efficiency of the photo-conversion material such as the quantum dot and the like (or minimizing deterioration of the luminous efficiency) during a color filtering process such as prebaking, exposure, development, washing, postbaking, and the like due to the binder resin including an acryl-based repeating unit including one or more thiol groups at the terminal end.

The acryl-based repeating unit including one or more thiol groups at the terminal end may be represented by Chemical Formula 1.

Chemical Formula 1

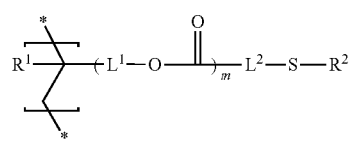

In Chemical Formula 1, $R^1$ is a hydrogen atom or a substituted or unsubstituted C1 to C6 alkyl group, $R^2$ is a substituted or unsubstituted C1 to C10 alkyl group including one or more terminal ends at the terminal end, a substituted or unsubstituted C6 to C20 aryl group including one or more terminal ends at the terminal end, or a substituted or unsubstituted C2 to C10 heteroaryl group including one or more terminal ends at the terminal end, $L^1$ is a single bond or a substituted or unsubstituted C1 to C10 alkylene group, $L^2$ is *-$L^a$-C(=O)—*, *—C(=O)O-$L^b$-O(C=O)NH-$L^c$-O(C=O)-$L^d$-*, *—C(=O)O-$L^e$-O-$L^f$-O(C=O)-$L^g$-*, a substituted or unsubstituted C1 to C10 alkylene group, or a substituted or unsubstituted C6 to C20 arylene group, $L^a$ to $L^g$ are independently a single bond or a substituted or unsubstituted C1 to C5 alkylene group, and m is an integer of 0 or 1.

For example, the $L^a$ to $L^g$ may independently be a hydroxy group-substituted or unsubstituted C1 to C5 alkylene group.

For example, the $L^f$ may be a hydroxy group-substituted C1 to C5 alkylene group.

For example, the $R^2$ may be a substituted or unsubstituted C1 to C10 alkyl group including one or more terminal ends at the terminal end or a substituted or unsubstituted C2 to C10 heteroaryl group including one or more terminal ends at the terminal end.

The $R^2$ may be a substituent selected from Chemical Formula 2-1 to Chemical Formula 2-3.

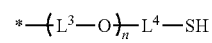
Chemical Formula 2-1

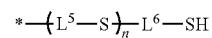
Chemical Formula 2-2

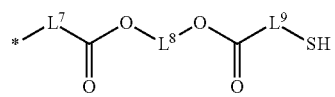
Chemical Formula 2-3

In Chemical Formulae 2-1 to 2-3, $L^3$ to $L^9$ are independently a substituted or unsubstituted C1 to C10 alkylene group, and n is an integer of 1 to 5.

The $R^2$ may be a substituent selected from Chemical Formulae A-1 to A-6, but is not limited thereto.

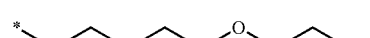
Chemical Formula A-1

Chemical Formula A-2

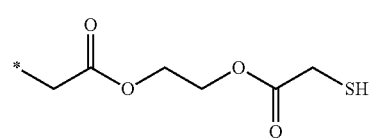
Chemical Formula A-3

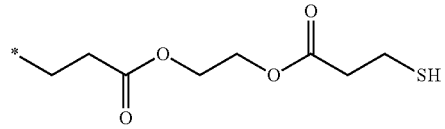
Chemical Formula A-4

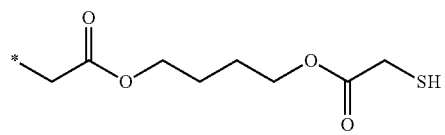
Chemical Formula A-5

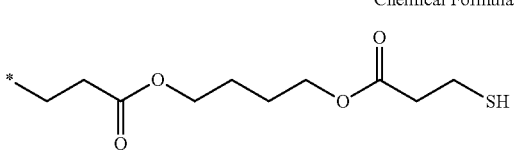
Chemical Formula A-6

The $R^2$ may be a substituent selected from Chemical Formulae 3-1 to 3-3.

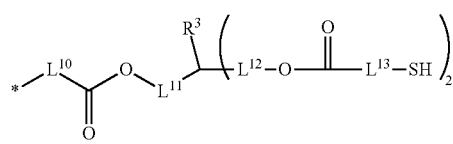
Chemical Formula 3-1

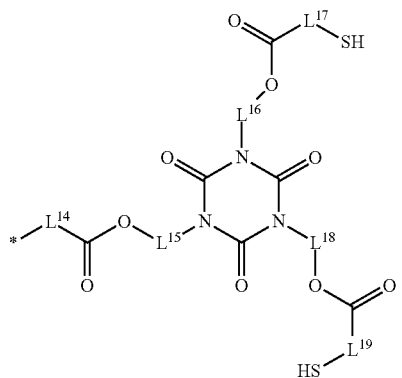
Chemical Formula 3-2

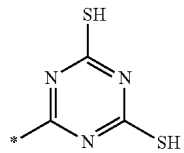
Chemical Formula 3-3

In Chemical Formulae 3-1 and 3-2, $R^3$ is a substituted or unsubstituted C1 to C10 alkyl group, and $L^{10}$ to $L^{19}$ are independently a substituted or unsubstituted C1 to C10 alkylene group.

The $R^2$ may be a substituent selected from Chemical Formula B-1 to Chemical Formula B-4, but is not limited thereto.

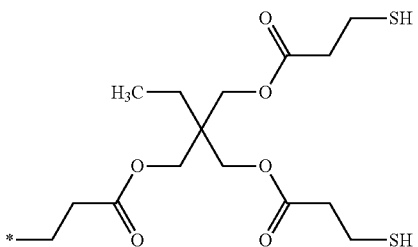
Chemical Formula B-1

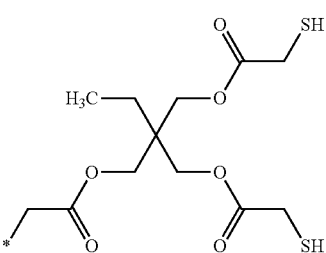
Chemical Formula B-2

Chemical Formula B-3

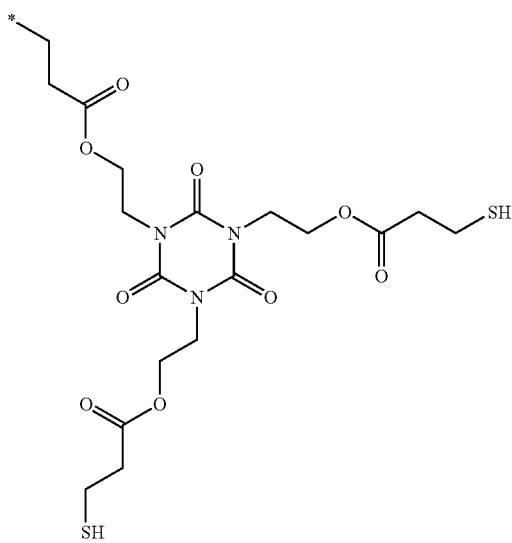

Chemical Formula B-4

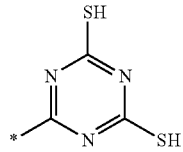

The R² may be a substituent represented by Chemical Formula 4-1.

Chemical Formula 4-1

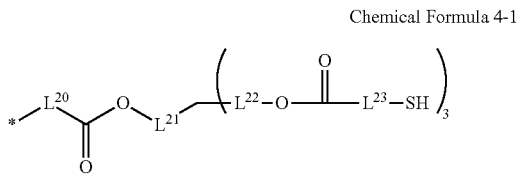

In Chemical Formula 4-1, $L^{20}$ to $L^{23}$ are independently a substituted or unsubstituted C1 to C10 alkylene group.

The R² may be a substituent represented by Chemical Formula C-1 or Chemical Formula C-2, but is not limited thereto.

Chemical Formula C-1

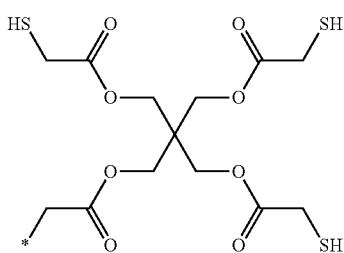

Chemical Formula C-2

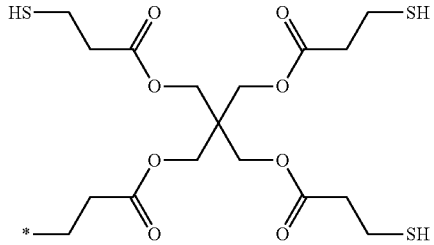

The R² may be a substituent represented by Chemical Formula 5-1.

Chemical Formula 5-1

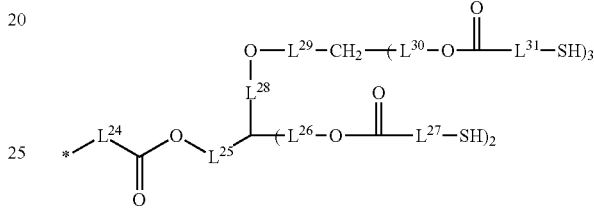

In Chemical Formula 5-1, $L^{24}$ to $L^{31}$ are independently a substituted or unsubstituted C1 to C10 alkylene group.

The R² may be a substituent represented by Chemical Formula D-1, but is not limited thereto.

Chemical Formula D-1

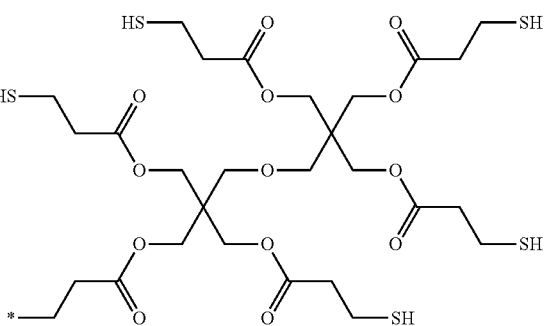

The binder resin may be at least one acryl-based a repeating unit that is a copolymer of a first ethylenic unsaturated monomer and a second ethylenic unsaturated monomer copolymerizable therewith in addition to the acryl-based repeating unit including one or more thiol groups at the terminal end.

The first ethylenic unsaturated monomer is an ethylenic unsaturated monomer including at least one carboxyl group. Examples of the monomer include acrylic acid, methacrylic acid, maleic acid, itaconic acid, fumaric acid, or a combination thereof.

The second ethylenic unsaturated monomer may be an aromatic vinyl compound such as styrene, α-methylstyrene, vinyl toluene, vinylbenzylmethylether, and the like; an unsaturated carboxylate ester compound such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; an unsaturated carboxylic acid amino alkyl ester compound such as 2-aminoethyl (meth)acrylate, 2-dimethylaminoethyl(meth)acrylate, and the like; a carboxylic acid vinyl ester compound such as vinyl acetate, vinyl benzoate, and the like; a unsaturated carboxylic acid glycidyl ester compound such as glycidyl (meth)acrylate, and the like; a vinyl cyanide compound such as (meth)acrylonitrile, and the like; a unsaturated amide compound such as (meth)acrylamide, and the like; and the like. These may be used alone or as a mixture of two or more.

The binder resin may have a weight average molecular weight of 3,000 g/mol to 100,000 g/mol, for example 5,000 g/mol to 50,000 g/mol, for example 15,000 g/mol to 30,000 g/mol. When the binder resin has a weight average molecular weight within the range, close-contacting properties to a substrate, and physical and chemical properties are improved and viscosity is appropriate.

The binder resin may have an acid value of 15 mgKOH/g to 100 mgKOH/g, for example 30 mgKOH/g to 50 mgKOH/g. When the binder resin has an acid value within the range, a pixel has excellent resolution.

The binder resin may be included in an amount of 1 wt % to 20 wt %, for example 3 wt % to 15 wt % based on the total amount of the photosensitive resin composition. When the binder resin is included within the range, excellent sensitivity, developability, resolution and linearity of a pattern may be obtained.

(C) Photopolymerization Initiator

The photopolymerization initiator may be a generally-used initiator for a photosensitive resin composition, and may be, for example an acetophenone-based compound, a benzophenone-based compound, a thioxanthone-based compound, a benzoin-based compound, a triazine-based compound, an oxime-based compound, and the like.

Examples of the acetophenone-based compound may be 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone-based compound may be benzophenone, benzoyl benzoate, benzoyl methyl benzoate, 4-phenyl benzophenone, hydroxybenzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone-based compound may be thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin-based compound may be benzoin, benzoin methyl ether, benzoin ethyl ether, benzoin isopropyl ether, benzoin isobutyl ether, benzyldimethylketal, and the like.

Examples of the triazine-based compound may be 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl-4,6-bis(trichloro methyl)-s-triazine, bis(trichloromethyl)-6-styryl-s-triazine, 2-(naphtho1-yl)-4,6-bis(trichloromethyl)-s-triazine, 2-(4-methoxynaphtho1-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime-based compound may be O-acyloxime-based compound, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like. Specific examples of the O-acyloxime-based compound may be 1,2-octandione, 2-dimethylamino-2-(4-methylbenzyl)-1-(4-morpholine-4-yl-phenyl)-butan-1-one, 1-(4-phenylsulfanyl phenyl)-butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-oneoxime-O-acetate, 1-(4-phenylsulfanyl phenyl)-butan-1-oneoxime-O-acetate, and the like.

The photopolymerization initiator may further include a carbazole-based compound, a diketone-based compound, a sulfonium borate-based compound, a diazo-based compound, an imidazole-based compound, a biimidazole-based compound, and the like besides the compound.

The photopolymerization initiator may be used with a photosensitizer capable of causing a chemical reaction by absorbing light and becoming excited and then, transferring its energy.

Examples of the photosensitizer may be tetraethylene glycol bis-3-mercapto propionate, pentaerythritol tetrakis-3-mercapto propionate, dipentaerythritol tetrakis-3-mercapto propionate, and the like.

The photopolymerization initiator may be included in an amount of 0.1 wt % to 5 wt %, for example 0.2 wt % to 1 wt % based on the total amount of photosensitive resin composition. When the photopolymerization initiator is included within the range, a balance between sensitivity and developability during exposure is improved and a pattern having improved resolution without a residual film may be obtained.

(D) Solvent

A photosensitive resin composition according to an embodiment includes a photo-conversion material such as a quantum dot instead of a pigment or a dye as a color material, and thus may include a solvent having compatibility with the photo-conversion material. Therefore, a photosensitive organic layer manufactured by curing the photosensitive resin composition according to an embodiment may have a significantly improved photo-conversion rate.

The solvent having compatibility with the photo-conversion material may be, for example, alkanes (R—H) such as pentane, hexane, heptanes, and the like; aromatic hydrocarbons (Ar—H) such as toluene, xylene, and the like; ethers (R—O—R) such as diisoamyl ether, dibutyl ether, and the like; alkyl halides (R—X) such as chloroform, trichloro methane, and the like; cycloalkanes such as cyclopropane, cyclobutane, cyclopentane, cyclohexane, and the like; and the like but is not limited thereto.

A photosensitive resin composition according to an embodiment may further include a solvent having compatibility with the binder resin and the photopolymerization initiator as well as a solvent having compatibility with the photo-conversion material as a solvent. However, because the binder resin, photopolymerization initiator and the like have compatibility with the solvent having compatibility with the photo-conversion material to a degree, but the photo-conversion material has almost no compatibility with the solvent having compatibility with the binder resin and the photopolymerization initiator, the photosensitive resin composition according to an embodiment may use only solvent having compatibility with the photo-conversion material or a mixture of the solvent having compatibility with the photo-conversion material and the solvent having compatibility with the binder resin and the photopolymerization initiator.

The solvent having compatibility with the binder resin and the photopolymerization initiator may be, for example, alcohols such as methanol, ethanol, and the like; glycol ethers such as ethylene glycol methylether, ethylene glycol ethylether, propylene glycol methylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like;

propylene glycol alkylether acetates such as propylene glycol monomethylether acetate, propylene glycol propylether acetate, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid alkyl esters such as methyl lactate, ethyl lactate, and the like; hydroxyacetic acid alkyl esters such as methyl hydroxyacetate, ethyl hydroxyacetate, butyl hydroxyacetate, and the like; acetic acid alkoxyalkyl esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-m ethylbutanoate, and the like; or ketonate ester compounds such as ethyl pyruvate and the like, and a solvent such as N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like may be also used, but is not limited thereto.

For example, considering compatibility and reactivity, the solvent having compatibility with the binder resin and the photopolymerization initiator may be glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol monomethylether acetate, propylene glycol propylether acetate, and the like may be preferably used.

The solvent is used in a balance amount, for example 50 wt % to 80 wt %, for example 60 wt % to 80 wt % based on the total amount of the photosensitive resin composition. When the solvent is within the range, the photosensitive resin composition has appropriate viscosity and thus may have excellent coating property when coated in a large area through spin-coating and slit-coating.

(E) Scatterer

A photosensitive resin composition according to an embodiment may further include a scatterer.

For example, the scatterer may include barium sulfate ($BaSO_4$), calcium carbonate ($CaCO_3$), titanium dioxide ($TiO_2$), zirconia ($ZrO_2$), or a combination thereof.

The scatterer reflects light not absorbed in the above photo-conversion material, so that the reflected light may be adsorbed again in the photo-conversion material. In other words, the scatterer increases a dose of the light absorbed in the photo-conversion material and thus photoconversion efficiency of the photosensitive resin composition.

The scatterer may have an average particle diameter ($D_{50}$) within a range of 150 nm to 250 nm and specifically, 180 nm to 230 nm. When the scatterer has an average particle diameter within the range, much more excellent light scattering effects may be obtained, and photoconversion efficiency may be increased.

The scatterer may be included in an amount of 0.1 wt % to 5 wt %, for example 1 wt % to 3 wt % based on the total weight of the photosensitive resin composition. When the scatterer is included in an amount of 0.1 wt % based on the total weight of the photosensitive resin composition, the scatter effect of improving photoconversion efficiency may be difficult to obtain, while when the scatterer is included in an amount of greater than 5 wt %, pattern characteristics of a photosensitive organic layer may be deteriorated.

(F) Photopolymerizable Monomer

A photosensitive resin composition according to an embodiment may further include a photopolymerizable monomer. The photopolymerizable monomer may include a multi-functional monomer having two or more hydroxyl groups.

The photopolymerizable monomer having two or more hydroxyl groups may cause sufficient polymerization during exposure in a pattern-forming process and form a pattern having excellent heat resistance, light resistance, and chemical resistance.

Specific examples of the photopolymerizable monomer may be glycerolacrylate, dipentaerythritolhexaacrylate, ethylene glycoldiacrylate, triethylene glycoldiacrylate, 1,4-butanedioldiacrylate, 1,6-hexanedioldiacrylate, neopentylglycoldiacrylate, pentaerythritoldiacrylate, pentaerythritoltriacrylate, pentaerythritol diacrylate, dipentaerythritoltriacrylate, dipentaerythritolacrylate, pentaerythritolhexaacrylate, bisphenolAdiacrylate, trimethylol propanetriacrylate, novolacepoxyacrylate, ethylene glycoldimethacrylate, diethylene glycoldimethacrylate, triethylene glycoldimethacrylate, propylene glycoldimethacrylate, 1,4-butanedioldimethacrylate, 1,6-hexanedioldimethacrylate, and the like, but are not limited thereto.

Commercially available examples of the photopolymerizable monomer are for example Aronix M-101®, M-111®, M-114® (Toagosei Chemistry Industry Co., Ltd.); KAYARAD TC-110S®, TC-120S® (Nippon Kayaku Co., Ltd.); V-158®, V-2311° (Osaka Organic Chemical Ind., Ltd.), and the like; Aronix M-210®, M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like; Aronix M-309®, M-400®, M-405®, M-450®, M-7100°, M-8030®, M-8060® (Toagosei Chemistry Industry Co., Ltd.), KAYARAD TMPTA®, DPCA-20®, DPCA-30®, DPCA-60®, DPCA-120® (Nippon Kayaku Co., Ltd.), V-295®, V-300®, V-360®, V-GPT®, V-3PA®, V-400® (Osaka Yuki Kayaku Kogyo Co. Ltd.), and the like. These may be used alone or as a mixture of two or more, but is not limited thereto.

The photopolymerizable monomer may be treated with acid anhydride to improve developability.

The photopolymerizable monomer may be included in an amount of 0.1 wt % to 30 wt %, for example 1 wt % to 10 wt % based on the total amount of the photosensitive resin composition. When the photopolymerizable monomer is included within the range, excellent pattern-forming capability and excellent durability (heat resistance, light resistance, and chemical resistance, etc.) may be obtained. Preferably, three or more multi-functional monomers may be effectively applied.

(G) Other Additives

A photosensitive resin composition according to an embodiment may include malonic acid; 3-amino-1,2-propanediol; a silane-based coupling agent; a leveling agent; fluorine-based surfactant; or a combination thereof in order to improve heat resistance and reliability.

For example, photosensitive resin composition may further include a silane-based coupling agent having a reactive substituent such as a vinyl group, a carboxyl group, a methacryloxy group, an isocyanate group, an epoxy group and the like in order to improve close contacting properties with a substrate.

Examples of the silane-based coupling agent may be trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyl)ethyltrimethoxysilane, and the like. These may be used alone or in a mixture of two or more.

The silane-based coupling agent may be used in an amount of 0.01 parts by weight to 10 parts by weight based on 100 parts by weight of the photosensitive resin composition. When the silane-based coupling agent is included within the range, close contacting properties, storage capability, and the like are improved.

The photosensitive resin composition may further include a surfactant, for example a fluorine-based surfactant as needed in order to improve coating properties and inhibit generation of spots, that is, improve leveling performance.

The fluorine-based surfactant may have a low weight average molecular weight of 4,000 g/mol to 10,000 g/mol, specifically 6,000 g/mol to 10,000 g/mol. In addition, the fluorine-based surfactant may have a surface tension of 18 mN/m to 23 mN/m (measured in a 0.1% polyethylene glycol monomethylether acetate (PGMEA) solution). When the fluorine-based surfactant has a weight average molecular weight and a surface tension within the range, leveling performance may be further improved, and excellent characteristics may be provided when slit coating as high speed coating is applied since film defects may be less generated by preventing a spot generation during the high speed coating and suppressing a vapor generation.

Examples of the fluorine-based surfactant may be, BM-1000®, and BM-1100® (BM Chemie Inc.); MEGAFACE F 142D®, F 172®, F 173®, and F 183® Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON 5-112®, SURFLON S-113®, SURFLON S-131®, SURFLON S-141®, and SURFLON 5-145® (ASAHI Glass Co., Ltd.); and SH-28PA®, SH-190®, SH-193®, SZ-6032®, and SF-8428®, and the like (Toray Silicone Co., Ltd.); F-482, F-484, F-478, F-554 and the like of DIC Co., Ltd.

The surfactant may further include a silicone-based surfactant in addition to the fluorine-based surfactant. Specific examples of the silicone-based surfactant may be TSF400, TSF401, TSF410, TSF4440, and the like of Toshiba silicone Co., Ltd., but is not limited thereto.

The surfactant may be included in an amount of 0.01 parts by weight to 5 parts by weight, for example 0.1 parts by weight to 2 parts by weight based on 100 parts by weight of the photosensitive resin composition. When the surfactant is included within the range, a foreign material is less produced after the development.

In addition, the photosensitive resin composition according to an embodiment may further include other additives such as an antioxidant, a stabilizer, and the like in a predetermined amount, unless properties are deteriorated.

According to another embodiment, a color filter manufactured using the photosensitive resin composition is provided. The color filter may be manufactured as follows.

(1) Application and Film Formation

The photosensitive resin composition is coated to have a desired thickness, for example, a thickness ranging from 2 μm to 10 μm, on a substrate which undergoes a predetermined pretreatment, using a spin or slit coating method, a roll coating method, a screen-printing method, an applicator method, and the like. Then, the coated substrate is heated at a temperature ranging from about 70° C. to about 90° C. for about 1 minute to about 10 minutes to remove a solvent.

(2) Exposure

The resultant film is radiated by an active ray such as UV ray of 190 nm to 450 nm, for example 200 nm to 500 nm after putting a mask with a predetermined shape to form a desired pattern. The radiation is performed by using a light source such as a mercury lamp with a low pressure, a high pressure, or an ultrahigh pressure, a metal halide lamp, an argon gas laser, and the like. An X ray, an electron beam, and the like may be also used as needed.

Exposure process uses, for example, a light dose of about 500 mJ/cm$^2$ or less (with a 365 nm sensor) when a high pressure mercury lamp is used. However, the light dose may vary depending on kinds of each component of the black photosensitive resin composition, its combination ratio, and a dry film thickness.

(3) Development

After the exposure process, an alkali aqueous solution is used to develop the exposed film by dissolving and removing an unnecessary part except the exposed part, forming an image pattern. In other words, when the alkali developing solution is used for the development, a non-exposed region is dissolved, and an image color filter pattern is formed.

(4) Post-Treatment

The developed image pattern may be heated again or radiated by an active ray and the like for curing, in order to accomplish excellent quality in terms of heat resistance, photo resistance, close contacting properties, crack-resistance, chemical resistance, high strength, storage stability, and the like.

MODE FOR INVENTION

Hereinafter, the present invention is illustrated in more detail with reference to examples. These examples, however, are not in any sense to be interpreted as limiting the scope of the invention.

Preparation of Binder Resin

Synthesis Example 1

A Binder Resin (a Weight Average Molecular Weight of 12,000 g/Mol) including a repeating unit represented by Chemical Formula 6-1, a repeating unit represented by Chemical Formula 6-2, and a repeating unit represented by Chemical Formula 6-3 was prepared by adding 9.36 g of pentaerythritol tetrakis(2-mercaptoacetate) (PE-TSA, JL Chem Co., Ltd.) and 46.7 g of propylene glycol monomethylether acetate (PGMEA) to 31.2 g of an acryl-based binder resin (AA-0325, Soltech Co., Ltd.) and stirring the mixture at room temperature for 12 hours. FIG. 1 is a nuclear magnetic resonance (NMR) data of the binder resin according to Synthesis Example 1.

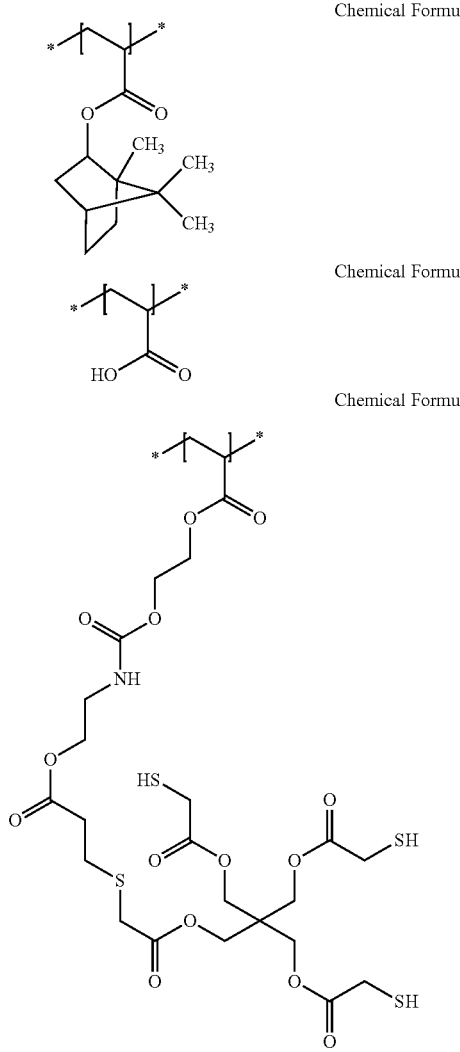

Chemical Formula 6-1

Chemical Formula 6-2

Chemical Formula 6-3

Synthesis Example 2

A binder resin (a weight average molecular weight of 12,000 g/mol) including a repeating unit represented by Chemical Formula 6-1, a repeating unit represented by Chemical Formula 6-2, and a repeating unit represented by Chemical Formula 6-4 was prepared by adding 6.81 g of pentaerythritol tetrakis(2-mercaptoacetate) (PE-TSA, JL Chem Co., Ltd.) and 34.1 g of propylene glycol monomethylether acetate (PGMEA) to 22.7 g of an acryl-based binder resin (PSA-1641, Soltech Co., Ltd.) and stirring the mixture at room temperature for 12 hours.

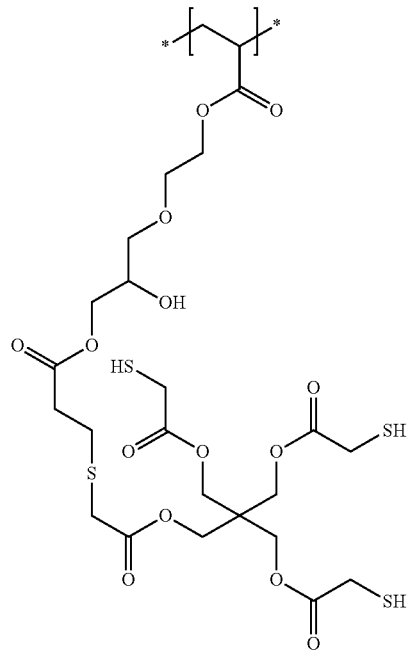

Chemical Formula 6-4

Evaluation 1: Luminous Efficiency of Quantum Dot

Each quantum dot dispersion liquid was prepared by mixing InP/ZnS quantum dot (0.6 g in 1.2 g of chloroform, Hansol Chemical Co., Ltd.) with each binder resin according to Synthesis Examples 1 and 2 and 1.2 g of a conventional acryl-based binder resin (AA-0325, PSA-1641, and SM-400H, SMS Co., Ltd.), and QY (a quantum yield) of the quantum dot dispersion liquid was measured depending on a hour, and the results are shown in Table 1.

TABLE 1

| | unit: % | | | | |
|---|---|---|---|---|---|
| Binder resin | Synthesis Example 1 | Synthesis Example 2 | AA-0325 | PSA-1641 | SM-400H |
| QY (8 hours after mixing) | 89.9 | 89.2 | 33.7 | 41.1 | 26.8 |
| QY (100 hours after mixing) | 71.7 | 68.5 | 9.4 | 23.4 | 11.7 |

As shown in Table 1, the quantum dot dispersion liquid prepared by mixing a quantum dot with each binder resin including an acryl-based repeating unit including one or more thiol groups at the terminal end (Synthesis Examples 1 and 2) showed high luminous efficiency but not much high luminous efficiency deterioration ratio compared with a quantum dot dispersion liquid prepared by using a conventional acryl-based binder resin (AA-0325, PSA-1641, and SM-400H).

Preparation of Photosensitive Resin Composition

Each photosensitive resin composition according to Examples 1 and 2 and Comparative Examples 1 to 3 was prepared by using the following components shown in Table 2.

Specifically, a photopolymerization initiator was dissolved in a solvent, and the solution was sufficiently stirred at room temperature for 2 hours. Subsequently, an acryl-based binder resin along with a photo-conversion material (a green quantum dot) and a dispersing agent (TEGO D685 made by EVONIK) were added thereto, and the obtained mixture was stirred again at room temperature for 2 hours. Then, a scatterer and a fluorine-based surfactant were added thereto, a mixture obtained therefrom was stirred at room temperature for one hour, and a product therefrom was three times filtered to remove impurities to prepare a photosensitive resin composition.

(A dispersing agent was added in an amount of 15 wt % relative to the green quantum dot solid)

(A) Photo-Conversion Material (Green QD)

InP/ZnS quantum dot (fluorescence $\lambda$em=525 nm, FWHM=40 nm, Green QD, Hansonl Chemical)

(B) Binder Resin (B-1) Acryl-based binder resin prepared in Synthesis Example 1

(B-2) Acryl-based binder resin prepared in Synthesis Example 2

(B-3) Acryl-based binder resin (AA-0325, Soltech)

(B-4) Acryl-based binder resin (PSA-1641, Soltech)

(B-5) Acryl-based binder resin (SM-400H, SMS)

(F) Photopolymerizable Monomer (F-1) Ethylene glycol bis(3-mercaptopropionate) (Wako Chemicals Inc.)

(F-2) Compound represented by Chemical Formula 7 (V1000, Osaka Organic Chemical Ind., Ltd.)

Chemical Formula 7

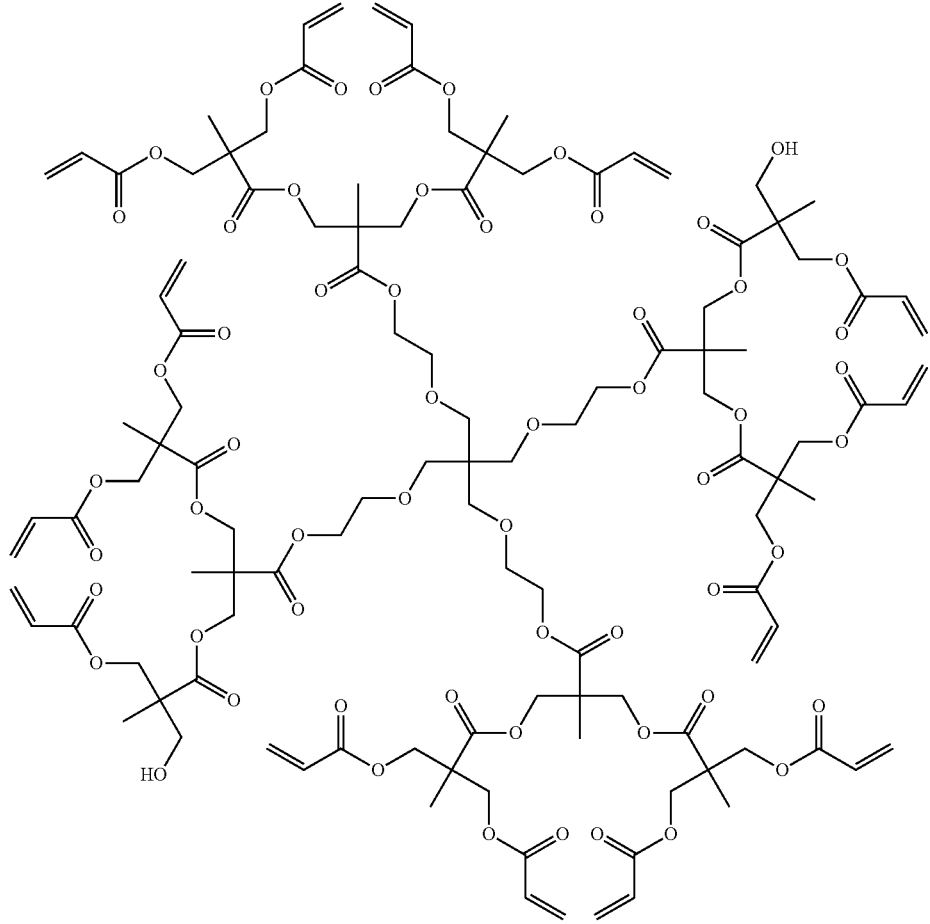

(F-3) Pentaerythritol hexamethacrylate (DPHA, Nippon Kayaku Co., Ltd.)
(C) Photopolymerization Initiator
  Oxime-based initiator (OXE02, BASF)
(D) Solvent
  (D-1) Cyclohexane (Sigma-Aldrich Corporation)
  (D-2) Propylene glycol monomethylether acetate (PG-MEA, Sigma-Aldrich Corporation)
(E) Scatterer
  Titanium oxide dispersion liquid ($TiO_2$ solid: 20 wt %, Average particle diameter: 200 nm, Ditto Technology)
(G) Other Additives
  Fluorine-based surfactant (F-554, DIC Co., Ltd.)

TABLE 2 unit: wt %

| | | Ex. 1 | Ex. 2 | Comp. Ex. 1 | Comp. Ex. 2 | Comp. Ex. 3 |
|---|---|---|---|---|---|---|
| (A) photo-conversion material | | 12 | 12 | 12 | 12 | 12 |
| (B) binder resin | B-1 | 25 | — | — | — | — |
| | B-2 | — | 25 | — | — | — |
| | B-3 | — | — | 25 | — | — |
| | B-4 | — | — | — | 25 | — |
| | B-5 | — | — | — | — | 25 |
| (F) photopolymerizable monomer | F-1 | 4.4 | 4.4 | 4.4 | 4.4 | 4.4 |
| | F-2 | 2.4 | 2.4 | 2.4 | 2.4 | 2.4 |
| | F-3 | 0.6 | 0.6 | 0.6 | 0.6 | 0.6 |
| (C) photopolymerization initiator | | 0.7 | 0.7 | 0.7 | 0.7 | 0.7 |
| (D) solvent | D-1 | 36 | 36 | 36 | 36 | 36 |
| | D-2 | 3 | 3 | 3 | 3 | 3 |
| (E) scatterer | | 15 | 15 | 15 | 15 | 15 |
| (G) other additives | | 0.9 | 0.9 | 0.9 | 0.9 | 0.9 |

Evaluation 2: Photo-Conversion Rate and Process Maintenance Rate of Quantum Dot

The photosensitive resin compositions according to Examples 1 and 2 and Comparative Examples 1 to 3 were respectively coated to be 10 µm-thick single films on a glass substrate using a spin-coater (150 rpm, Opticoat MS-A150, Mikasa Co., Ltd.) and pre-baked (PRB) on a hot-plate at 100° C. for 2 minutes, and their initial blue photo-conversion rates were measured.

Then, the coated photosensitive resin compositions were radiated by UV with an exposer (Ghi broadband, Ushio Inc.) with an output (power) of 100 mJ/$cm^2$ and post-baked (POB) in a convection clean oven (Jongro Co., Ltd.) at 180° C. for 30 minutes, and their blue photo-conversion rates were measured.

As for the pre-baking and post-baking, a photo-conversion rate from blue light entering from backlight unit (BLU) into green light and a process maintenance rate were evaluated, and the results are shown in Table 3. Herein, the blue photo-conversion rate (green/blue) was measured by using a CAS 140 CT spectrometer equipment and specifically, by putting a bare glass on the blue BLU covered with a diffusing film to first get a reference measured with a detector and then, putting single films obtained by respectively coating the photosensitive resin compositions according to Examples 1 and 2 and Comparative Examples 1 to 3 and measuring a blue-to-green converted peak increase amount relative to a blue absorption peak decrease amount. In addition, the process maintenance rate was also obtained by measuring how much a photo-conversion rate of the initial PRB step was maintained in the POB step, that is, how much the photo-conversion rate was maintained from the PRB step to the POB step.

TABLE 3 unit: %

| | Example 1 | Example 2 | Comparative Example 1 | Comparative Example 2 | Comparative Example 3 |
|---|---|---|---|---|---|
| Initial photo-conversion rate | 30.4 | 33.6 | 24.1 | 23.4 | 27.2 |
| Process maintenance ratio (%) | 93 | 95 | 76 | 74 | 80 |

As shown in Table 3, the photosensitive resin compositions according to Examples 1 and 2 showed a small blue photo-conversion deterioration rate and a high process maintenance rate during the color filter process compared with the photosensitive resin compositions according to Comparative Examples 1 to 3. Accordingly, the photosensitive resin composition including a binder resin including a repeating unit including one or more thiol groups at the terminal end, for example, an acryl-based repeating unit represented by Chemical Formula 1 and a photo-conversion material such as a quantum dot and the like may be prevented from deterioration of a blue photo-conversion rate in every color filter process and thus effectively increase a process maintenance rate compared with a photosensitive resin composition including a conventional binder resin and a photo-conversion material such as a quantum dot and the like.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

The invention claimed is:

1. A photosensitive resin composition, comprising:
  (A) a photo-conversion material;
  (B) a binder resin including an acryl-based repeating unit including one or more thiol groups at a terminal end;
  (C) a photopolymerization initiator; and
  (D) at least 25 wt % of a solvent based on a total amount of the photosensitive resin composition.

2. The photosensitive resin composition of claim 1, wherein the photosensitive resin composition further includes (E) a scatterer.

3. The photosensitive resin composition of claim 2, wherein the scatterer includes barium sulfate, calcium carbonate, titanium dioxide, zirconia, or a combination thereof.

4. The photosensitive resin composition of claim 2, wherein the scatterer is included in an amount of 0.1 wt % to 5 wt % based on the total weight of the photosensitive resin composition.

5. The photosensitive resin composition of claim 1, wherein the photosensitive resin composition further includes a photopolymerizable monomer.

6. The photosensitive resin composition of claim 1, wherein the photo-conversion material is a quantum dot that absorbs light in a wavelength region of 360 nm to 780 nm and emits fluorescence in a wavelength region of 500 nm to 700 nm.

7. The photosensitive resin composition of claim 1, wherein the photosensitive resin composition includes:
1 wt % to 50 wt % of the (A) photo-conversion material;
10 wt % to 20 wt % of (B) the binder resin;
0.1 wt % to 5 wt % of (C) the photopolymerization initiator; and
a balance amount of (D) the solvent
based on the total amount of the photosensitive resin composition.

8. The photosensitive resin composition of claim 1, wherein the photosensitive resin composition further include malonic acid; 3-amino-1,2-propanediol; a silane-based coupling agent; a leveling agent; fluorine-based surfactant; or a combination thereof.

9. A photosensitive resin layer manufactured using the photosensitive resin composition of claim 1.

10. A color filter comprising the photosensitive resin layer of claim 9.

11. A photosensitive resin composition, comprising:
(A) a photo-conversion material;
(B) a binder resin including an acryl-based repeating unit including one or more thiol groups at a terminal end;
(C) a photopolymerization initiator; and
(D) a solvent,
wherein the acryl-based repeating unit including one or more thiol groups at the terminal end is represented by Chemical Formula 1:

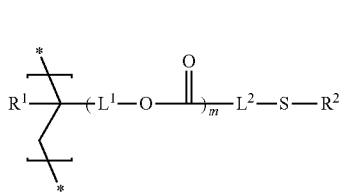

Chemical Formula 1 wherein, in Chemical Formula 1,
R$^1$ is a hydrogen atom or a substituted or unsubstituted C1 to C6 alkyl group,
R$^2$ is a substituted or unsubstituted C1 to C10 alkyl group including one or more terminal ends at the terminal end, a substituted or unsubstituted C6 to C20 aryl group including one or more terminal ends at the terminal end, or a substituted or unsubstituted C2 to C10 heteroaryl group including one or more terminal ends at the terminal end,
L$^1$ is a single bond or a substituted or unsubstituted C1 to C10 alkylene group,
L$^2$ is *-L$^a$-C(=O)—*, *—C(=O)O-L$^b$-O(C=O)NH-L$^c$-O(C=O)-L$^d$-*, *—C(=O)O-L$^e$-O-L$^f$-O(C=O)-L$^g$-*, a substituted or unsubstituted C1 to C10 alkylene group, or a substituted or unsubstituted C6 to C20 arylene group,
L$^a$ to L$^g$ are independently a single bond or a substituted or unsubstituted C1 to C5 alkylene group, and
m is an integer of 0 or 1.

12. The photosensitive resin composition of claim 11, wherein the L$^f$ is a hydroxy group-substituted C1 to C5 alkylene group.

13. The photosensitive resin composition of claim 11, wherein the R$^2$ is a substituent selected from Chemical Formulae 2-1 to 2-3:

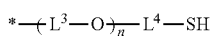

Chemical Formula 2-1

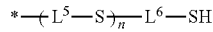

Chemical Formula 2-2

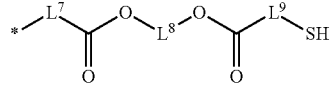

Chemical Formula 2-3 wherein, in Chemical Formulae 2-1 to 2-3,
L$^3$ to L$^9$ are independently a substituted or unsubstituted C1 to C10 alkylene group, and
n is an integer of 1 to 5.

14. The photosensitive resin composition of claim 13, wherein the R$^2$ is a substituent selected from Chemical Formulae A-1 to A-6:

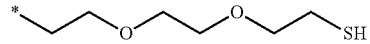

Chemical Formula A-1

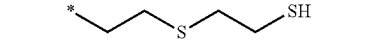

Chemical Formula A-2

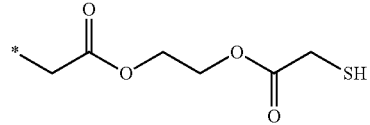

Chemical Formula A-3

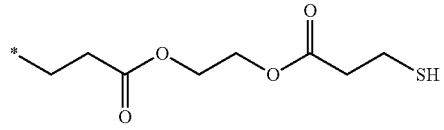

Chemical Formula A-4

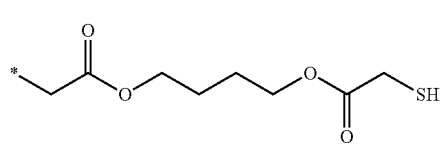

Chemical Formula A-5

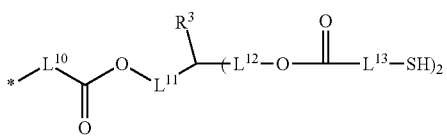

Chemical Formula A-6

15. The photosensitive resin composition of claim 11, wherein the R$^2$ is a substituent selected from Chemical Formula 3-1 to Chemical Formula 3-3:

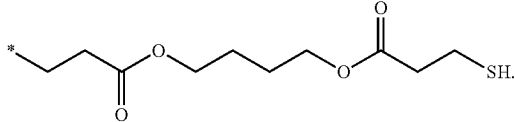

Chemical Formula 3-1

Chemical Formula 3-2

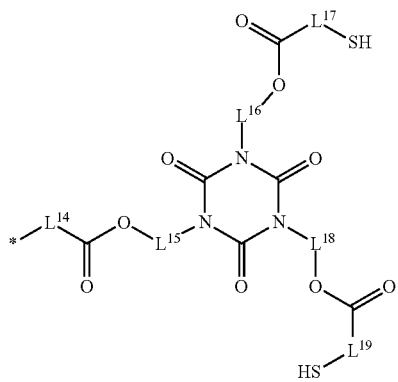

Chemical Formula 3-3

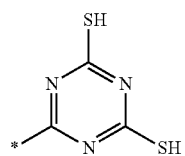

wherein, in Chemical Formulae 3-1 and 3-2,
  $R^3$ is a substituted or unsubstituted C1 to C10 alkyl group, and
  $L^{19}$ to $L^{19}$ are independently a substituted or unsubstituted C1 to C10 alkylene group.

16. The photosensitive resin composition of claim 15, wherein the $R^2$ is a substituent selected from Chemical Formula B-1 to Chemical Formula B-4:

Chemical Formula B-1

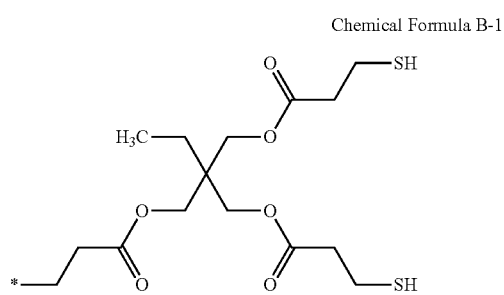

Chemical Formula B-2

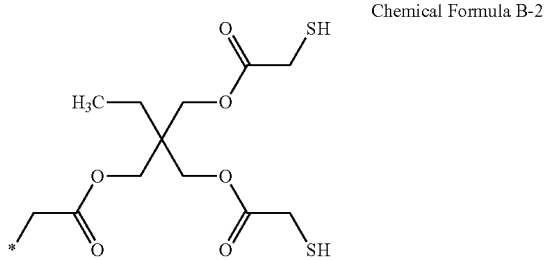

Chemical Formula B-3

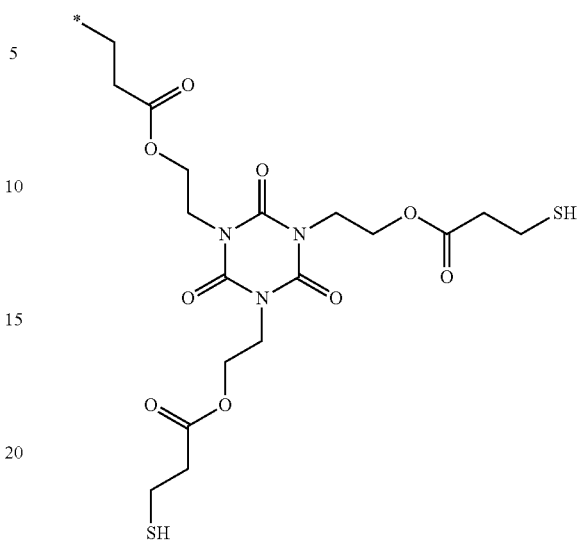

Chemical Formula B-4

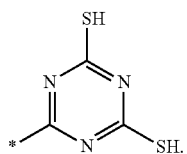

17. The photosensitive resin composition of claim 11, wherein the $R^2$ is a substituent represented by Chemical Formula 4-1:

Chemical Formula 4-1

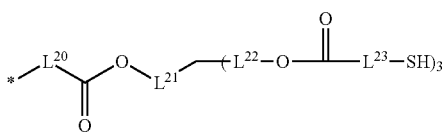

wherein, in Chemical Formula 4-1,
  $L^{20}$ to $L^{23}$ are independently a substituted or unsubstituted C1 to C10 alkylene group.

18. The photosensitive resin composition of claim 17, wherein the $R^2$ is a substituent represented by Chemical Formula C-1 or C-2:

Chemical Formula C-1

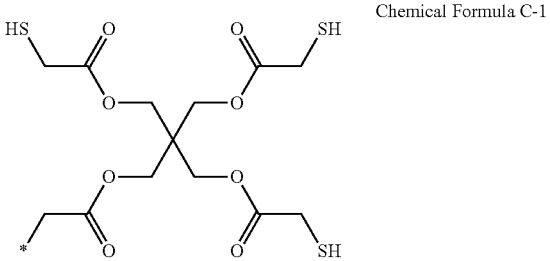

Chemical Formula C-2

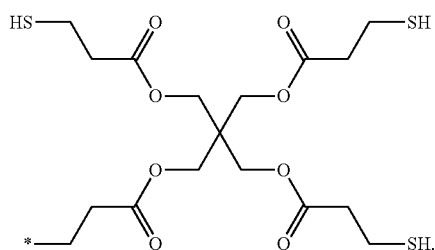

19. The photosensitive resin composition of claim 11, wherein the $R^2$ is a substituent represented by Chemical Formula 5-1:

Chemical Formula 5-1

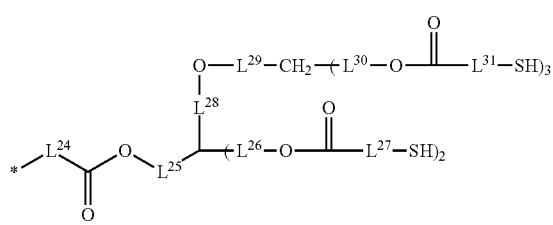

wherein, in Chemical Formula 5-1, $L^{24}$ to $L^{31}$ are independently a substituted or unsubstituted C1 to C10 alkylene group.

20. The photosensitive resin composition of claim 19, wherein the $R^2$ is a substituent represented by Chemical Formula D-1:

Chemical Formula D-1

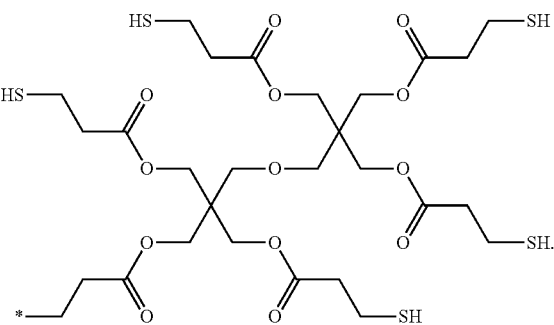

* * * * *